United States Patent [19]

Miyake et al.

[11] Patent Number: 4,585,541
[45] Date of Patent: Apr. 29, 1986

[54] PLASMA ANODIZATION SYSTEM

[75] Inventors: Kiyoshi Miyake, Tsukui; Shinichiro Kimura, Hachioji; Terunori Warabisako, Nishitama, all of Japan

[73] Assignee: Hitachi, Ltd., Tokyo, Japan

[21] Appl. No.: 669,347

[22] Filed: Nov. 8, 1984

[30] Foreign Application Priority Data

Nov. 11, 1983 [JP] Japan .................. 58-210835

[51] Int. Cl.$^4$ .............................. C23C 14/00
[52] U.S. Cl. ...................... 204/298; 204/164; 204/192 R; 118/50.1; 118/723; 156/345
[58] Field of Search ............ 204/192 R, 164, 298; 118/50.1, 723; 156/345

[56] References Cited

U.S. PATENT DOCUMENTS 4,180,450 12/1979 Morrison ............ 204/192 R

OTHER PUBLICATIONS

Physics & Chem. Dictionary (3rd Ed. 1971), p. 241.
Introduction to Plasma Physics, Chen, 1974, pp. 38–41.
Advances in Plasma Physics, Chen, vol. 4, (1971), pp. 79–83, 120–122.

*Primary Examiner*—R. L. Andrews
*Attorney, Agent, or Firm*—Antonelli, Terry & Wands

[57] ABSTRACT

A cusp field is applied between a plasma source of a vacuum chamber of a plasma anodization system and a substance such as a semiconductor substrate or a metal plate to be oxidized so that the substance may not be adversely affected by the plasma. The temperature control can be conducted independently of the plasma generating condition because the substance to be treated is not adversely affected by the plasma in a direct manner.

14 Claims, 8 Drawing Figures

PLASMA ANODIZATION SYSTEM

BACKGROUND OF THE INVENTION

The present invention relates to a system for anodizing the surface layer of semiconductor materials such as Si or GaAs or superconducting materials such as Pb or Nb at a relatively low temperature with active species which are generated in a gas plasma containing oxygen.

A plasma anodization method is well known in the art as a method of oxidizing the surface of GaAs or Si at a relatively low temperature. This method is disclosed, for example, in Takuo Sugano, Semiconductor Plasma Technique, Sangyo Tosho, Tokyo (1980), pp. 83-91. According to one representative method, substances to be oxidized such as GaAs or Si are placed in an oxygen plasma which is generated by an RF (i.e., radio-frequency) or microwave power. According to this method of the prior art, however, the substances being oxidized have their surfaces irradiated with all active species (e.g., ions, electrons, excited atoms, excited molecules or photons) that are present in the oxygen plasma. Of these active species, moreover, most of the ions and electrons frequently irradiate the substrate with a high energy. As a result, the electrical properties of a MOS (i.e., metal-oxide-semiconductor) transistor, which is fabricated by making use of the interface between the oxide (e.g., $SiO_2$) layer formed and the substrate (e.g., Si), are frequently inferior to those of the MOS transistor which uses the oxide film of $SiO_2$ prepared by a thermal oxidation method.

Since the surfaces of the substances are exposed to various radiations from the plasma, moreover, it is difficult to control the oxidation parameter such as the temperature of the substances independently of the plasma generating conditions.

One of the plasma anodization methods of the prior art is disclosed in U.S. Pat. No. 4,232,057, as shown in FIG. 1. In this Figure: reference numeral 11 indicates a container; numeral 12 an oxygen atmosphere; numeral 13 an induction coil; numeral 16 a radio-frequency source; numeral 17 a plasma region; numeral 18 substrates; numeral 19 a holder; numeral 110 a heating source; numeral 111 a vacuum gauge; and numerals 112 and 115 indicate valves.

This discloses a technique that the control of a plasma power and the controls of the flow rate and pressure of oxygen are independent and that a uniform plasma-anodized substance can be formed by placing the substrates outside of the plasma region so that they can be provided independently of the temperature control. Despite of this fact, however, no consideration is taken into the influences due to the plasma.

There is also disclosed in Japanese Patent Laid-Open No. 56 - 37633 anodizing method which uses a plasma and a laser, as shown in FIG. 2.

In this Figure: reference numeral 21 indicates a laser source; numeral 22 a laser beam; numeral 23 a lens; numeral 24 a silicon substrate; numeral 25 a plasma generating chamber; numeral 28 a substrate table; numeral 29 an AC power supply; and numeral 210 a plasma generating coil.

According to this disclosure, the anodization is effected by instantly heating surface of the semiconductor substrate by the laser beam.

Since the heating is conducted by the laser beam, according to this method, the portions other than the heated portion can be left at a low temperature. However, this invites undesirable results because a thermal stress is caused between the portions heated by the laser beam and the other portions.

SUMMARY OF THE INVENTION

An object of the present invention is to provide a plasma anodization system which can form an oxide film having excellent electrical properties.

Another object of the present invention is to provide a plasma anodization system which can control the temperature of substances to be oxidized independently of the discharge condition of a plasma.

In order to achieve the above-specified objects, according to the present invention, there is provided a novel plasma anodization system which can make excellent the electrical properties at the interface between an oxidized layer and a substrate by spacially separating a plasma source and a substance (e.g., Si, GaAs, Pb or Nb) to be oxidized from each other and by applying a cusp field inbetween thereby to prevent the surface of the substrate from being bombarded by ions or electrons at a high speed.

Here, the "cusp field" means one of magnetic field configurations for confining a hot plasma. One of the typical configurations is made by arranging four straight conductors in parallel with one another and by supplying electrical currents in opposite directions to the adjoining two of the conductors. The cusp field is named because the end of the plasma in the plasma confining region forms a cusp, and the plasma region itself is called the "cusp". The confinement is macroscopically stable but is characterized in that escape of species from the cusp (i.e., the cusp loss) is large because the magnetic field has a zero point in the center of the cusp. The present invention makes use of this cusp loss.

We have thought that, since the substance is inserted into the plasma in the plasma anodization system of the prior art, the ions or electrons present in the plasma irradiate the thin oxide layer with a high energy, which is a major cause for degrading the electrical properties of the interface between the oxide layer and the substrate.

On the other hand, generally speaking, the plasma is liable to diffuse in the direction of the magnetic field but is reluctant to diffuse across the magnetic field. If, therefore, the cusp field is generated by making use of the above characteristics on an axis joining the plasma source and the substrate to be oxidized, most of the high-energy charged particles such as the ions or electrons are caused to bombard the wall of the vacuum chamber so that they can recombine to be neutralized.

As a result, the neutralized oxygen atoms and molecules and their excited particles, which are free from the influences of the cusp field, reach the surface of the substrate to be oxidized. According to this method, on the other hand, the surface of the substrate being oxidized is not irrdiated by the high-energy ions or electrons so that a thin oxide film having excellent electrical properties can be obtained.

In other words, the most important point of the present invention is that the magnetic lines extending from the plasma source fail to reach the sample to be oxidized. Since the plasma diffuses along the magnetic lines, it does not reach the sample unless the magnetic lines reach the sample to be oxidized. The most important point is sufficiently satisfied if the magnetic lines diverge toward the wall of the vacuum chamber.

FIG. 3 is a diagram showing the potential distribution when a positive bias voltage $V_B$ is applied to the sample to be oxidized.

In FIG. 3, reference numerals 31, 32 and 33 indicate a sample to be oxidized, an oxide layer, and a weakly ionized secondary plasma, respectively. This further improves the present invention.

At the sample side of the cusp field, specifically, there is usually generated a plasma which is weakly ionized. This weakly ionized secondary plasma is generated because of two reasons: one is that the transmitted microwave power through the plasma source region to ionize the gas at the side of the sample to be oxidized, and the other is that the particles at the righthand side of the drawing are ionized by the plasma particles in a plane normal to the drawing containing reference numeral 61 of FIG. 6. Even in this case, theoretically, the lefthand plasma never diffuses across the aforementioned boundary. Strictly, the righthand particles are ionized by the influences of the lefthand plasma. When the sample to be oxidized is applied with the bias voltage which is positive with respect to the plasma, the bias voltage is predominantly applied to the thin oxidized layer whereas the plasma sheath adjacent to the oxidized layer is merely applied with the low voltage Vs so that the energy of electron accelerated thereat and irradiated to the oxidized layer is at most about 10eV as shown in FIG. 3.

Generally speaking, the radiation of low-energy electrons is known to have an effect to dissociatively adsorb oxygen molecules on a solid surface. As a result, the oxidation is promoted by the presence of a plasma sheath. Moreover, the application of the electric field to a thin oxide layer facilitate migrations of oxygen in the oxide layer so that the plasma anodization is further promoted.

Summing up the foregoing description, an oxide layer of high quality can be formed for a short time period thanks to the presence of the cusp field and by applying the bias voltage. It is the plasma anodization system that uses the above effect.

DESCRIPTION OF THE PREFERRED EMBODIMENTS

Embodiment 1

Figure 1:
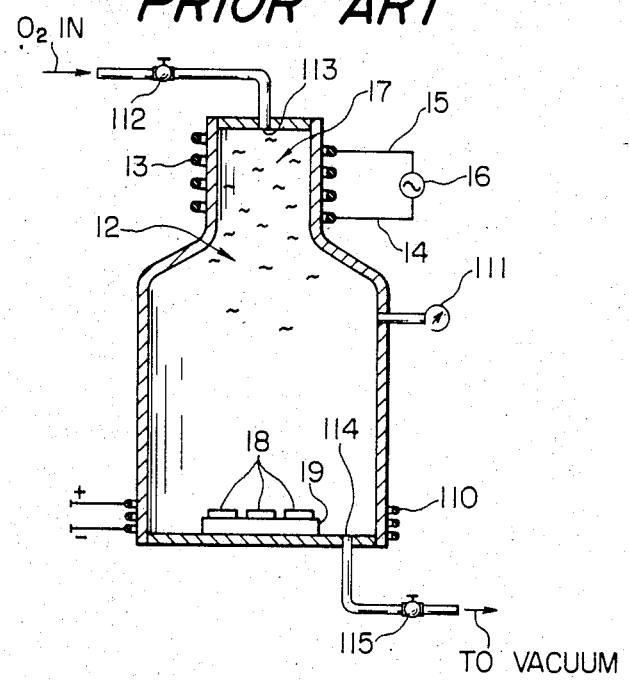
FIGS. 1 and 2 are sectional views showing the plasma anodization systems according to the prior art.
Figure 2:
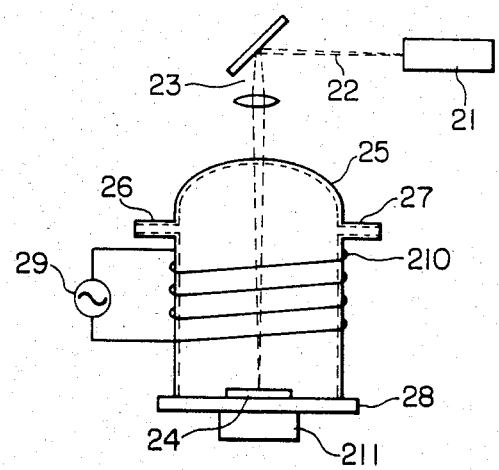
Figure 3:
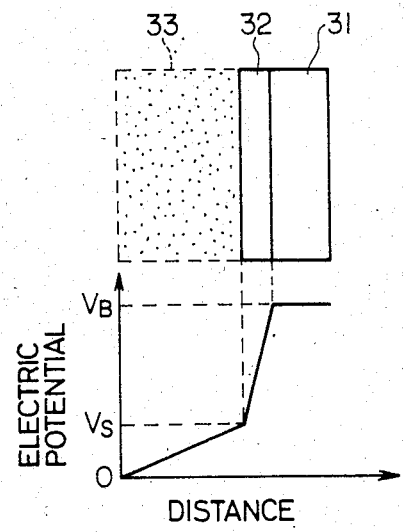
FIG. 3 is a diagram showing the voltage to be applied to the sample to be oxidized and the plasma sheath.
Figure 4:
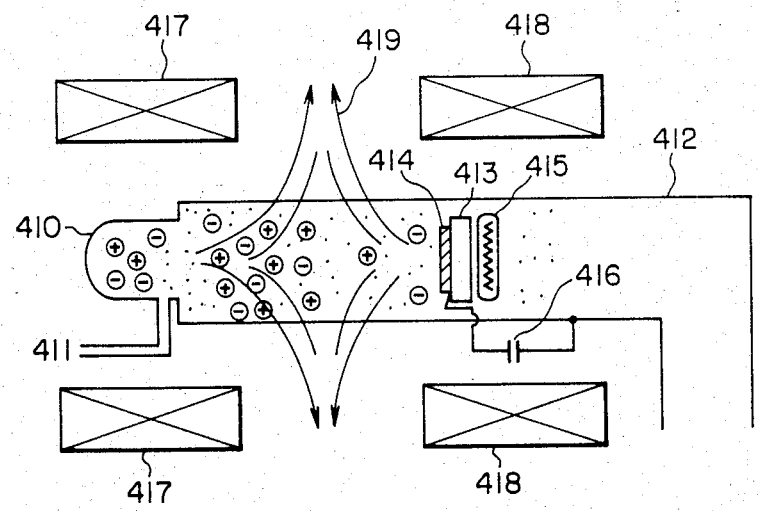
FIG. 4 is a sectional view showing a first embodiment of the present invention.

A first embodiment of the present invention will be described in the following with reference to FIG. 4 by taking up a plasma anodization of silicon as an example. The plasma anodization system of the present invention is constructed of a plasma source 410, a gas inlet 411, a vacuum chamber 412, a sample holder 413, a sample 414 to be oxidized, a sample heater 415, a bias power supply 416, and air core coils 417 and 418. Reference numeral 419 indicates magnetic field lines, and numeral 420 and 421 indicate plasmas.

The air core coils 417 and 418 are shaped cylindrical and wound around the vacuum chamber 412, as shown. These air core coils 417 and 418 can be replaced by permanent magnets, and especially the coil 418 can be replaced by the permanent magnet which is placed at the back of the heater 415 in the vacuum chamber 412. This vacuum chamber 412 may be made of quartz at its necessary portion and a conducting material such as stainless steel at its portion requiring conductivity. DC currents of opposite directions are applied to the air core coils 417 and 418 to generate the cusp field.

The operations of the system of the present invention will be described in the following.

Oxygen gases are introduced through the gas inlet 411 into the vacuum chamber 412 to set the vacuum in the plasma source 410 at the level of $1 \times 10^{-4}$ Torr. After this procedure, although not shown, microwaves of 2.45 GHz are supplied to the plasma source 410 by the use of a microwave supply to generate an oxygen plasma in the plasma source 410. At this time, the air core coil 417 is excited so that a magnetic field in the plasma source is utilized to increase the density of the plasma. Here, the air core coils 417 and 418 are arranged such that the vacuum chamber 412 is at their center. In other words, the air core coils 417 and 418 are arranged around and spaced from the vacuum chamber 412.

The oxygen plasma generated in the plasma source 410 has a property to diffuse downstream of the vacuum chamber 412. By further exciting the air core coil 418 just in the opposite direction to that of the air core coil 417, moreover, the cusp field is generated between the plasma source 410 and the sample 414 to be oxidiized.

Of the particles carried in the oxygen plasma diffusing from the plasma source 410, substantially all the charged ions and electrons are caused by the action of the cusp field to impinge upon the wall of the vacuum chamber 412 so that they recombine to lose their energies.

On the other hand, the excited oxygen species which are carried in the oxygen plasma and which are electrically neutral, are carried to the surface of the sample 414 without being influenced by the cusp field.

A 3-inch silicon wafer exemplifying the sample 414 is heated up to 600° C. by the action of the sample heater 415.

Since, moreover, the vacuum level near the sample 414 is about $10^{-4}$ Torr, a weakly ionized secondary plasma is present near the sample 414. A positive voltage of +50 V was applied to the sample 14 with respect to the secondary plasma by the action of the bias power supply 416 so that the sample 414 had its surface radiated by the slow electrons in the secondary plasma to promote its oxidization.

A silicon dioxide layer having a thickness of 400 Å was formed by exposing the single crystal of silicon to the oxygen plasma for one hour in the method thus far described.

Embodiment 2

Next, a second embodiment of the present invention will be described in the following with reference to FIG. 5 by taking up the plasma anodization of silicon as an example.

The system used in the present embodiment is called the "microwave plasma anodization system having magnetic field", and uses a plasma source for generating a plasma by a microwave power. (The construction of the plasma source is disclosed in detail in K. Miyake et al., Journal of Vacuum Science & Technology, A2 (1984), pp. 496–499.) For realizing the present invention, however, there can also be used as the plasma source one which is generated by a DC discharge, a radio-frequency discharge or a microwave discharge of another frequency.

Figure 5:
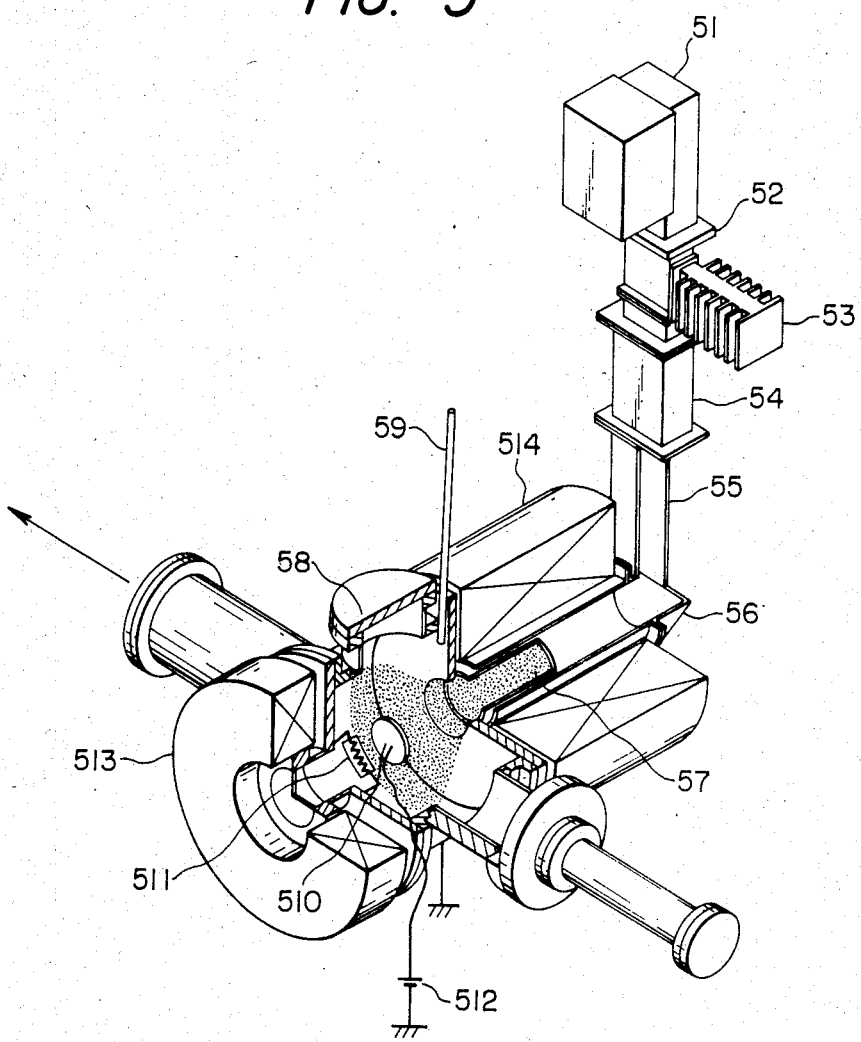
FIG. 5 is a partially cut-away perspective view showing a second embodiment of the present invention.

In the present embodiment, as shown in FIG. 5, a microwave power having a frequency of 2.45 GHz is generated by a magnetron 51 and is guided to a discharge cell 57 made partially of quartz through a tapered square-waveguide 52, an isolator 53 for absorbing the reflected microwaves from the plasma, a power meter 54 for monitoring the microwave power, a tapered square-waveguide 55 and a circular waveguide 56.

A magnetic field having an intensity of 875 gausses is applied by the action of an air core coil 513 to a region where the discharge cell is placed. This is because the microwave power of 2.45 GHz is absorbed efficiently by the plasma on the basis of the principle of electron cyclotron resonance heating and because the intensity of the electron cyclotron resonance magnetic field corresponding to 2.45 GHz is 875 gausses. The frequency f (Hz) is expressed by the following formula, if m designates the mass (Kg) of an ion or electron and B designates a magnetic field (Tesla) and E designates an electric charge ($1.6 \times 10^{-19}$C):

$$f = eB/2\pi m.$$

In this example, the frequency f is calculated, as follows:

$$f = 0.28 \times 10^7 \times 875 \times 10^{-4}$$
$$= 2.45 \times 10^9 \text{ (Hz)}.$$

The discharge cell 57 is connected to a vacuum chamber 58 which is evacuated by a turbomolecular pump, so that the oxygen gases for generating an oxygen plasma are introduced through a gas inlet 59 attached to the side wall of the vacuum chamber. With the construction thus far described, a high-density oxygen plasma is generated in the discharge cell 57 for the oxygen gas pressure of $1 \times 10^{-4}$ Torr and the microwave power of 150 W.

In the vacuum chamber, a silicon wafer 510 to be oxidized is placed on a sample heater 511. This silicon wafer is electrically connected with a bias power supply 512 so that it is supplied with a potential which is positive with respect to the plasma.

For the sample 510 to be oxidized, there is disposed at a position opposite to the plasma source an air core coil 513 for generating the cusp field. (It is also quite natural to replace the air core coil by a permanent magnet.) In this case, the current for exciting the second air core coil 513 is directed oppositely of a first air core coil 514 and has its level adjusted so that the center 61 of the cusp field, at which the intensity of the magnetic field is at zero, is at a position in front of the sample.

Figure 6:
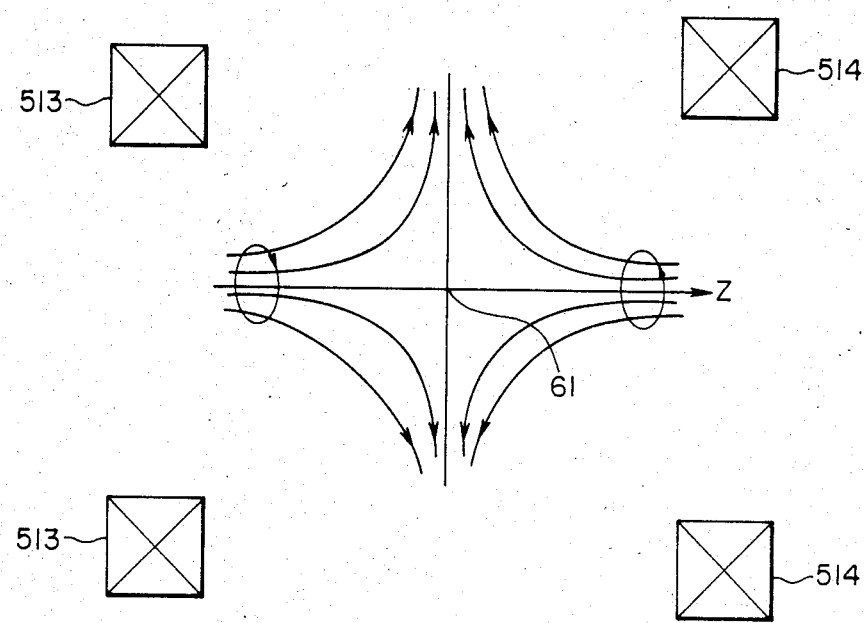
FIG. 6 is a schematic diagram showing the cusp field.

By generating the cusp field, as has been described above, the plasma flow diffusing from the plasma source will diverge along the cusp field which diverges toward the wall of the vacuum chamber. FIG. 6 shows the divergence of the plasma flow coming from the plasma source and is taken in the direction perpendicular to the axial direction. The numerals 513 and 514 indicate the air core coils which have been described in connection with FIG. 5. The table placing the silicon wafer thereon is positioned outside of the plasma flow (i.e., at the lefthand side of the center 61).

In the state thus far described, the silicon wafer to be oxidized was heated to 600° C., and the plasma was generated for one hour. As a result, a silicon dioxide layer having a thickness of 300 Å was formed on the surface of the silicon. In this case, the bias voltage applied to the silicon wafer was zero.

Next, a voltage of +50 V was applied to the silicon wafer by the use of the bias voltage, and the anodization was conducted under the same plasma condition. Then, a silicon dioxide layer having a thickness of 400 Å was formed. The deviation of the thickness of the silicon dioxide layer on the silicon wafer was within a range of ±5%.

The optical and electrical properties of the silicon dioxide layer thus formed under the two conditions as above were tested by the following method.

Figure 7:
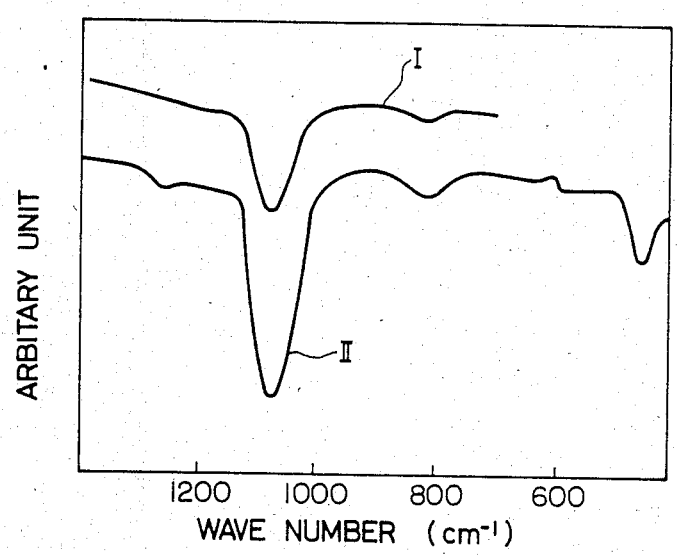
FIGS. 7 and 8 are diagrams showing the properties of the oxide film which is fabricated according to the present invention.

The infrared absorption characteristics of the oxide layer are depicted in FIG. 7, in which curve I corresponds to the oxide layer formed by the plasma anodization whereas curve II corresponds to the oxide layer by the thermal oxidation. For measuring the infrared absorption characteristics, a Fourier transformed infrared spectrometer with high sensitivity was used. Like the thermally oxidized layer, the peak of infrared absorption based upon the vibration and stretching of the silicon and oxygen appears near a wave number of 1,070 cm$^{-1}$. The position and half width of the peak is not different from the case of the thermally oxidized layer.

As the serious disadvantage of the oxide layer formed by the plasma anodization of the prior art, there can be enumerated a fact that the density of interface state is as large as $10^{12}$ to $10^{14}$ cm$^2 \cdot$eV$^{-1}$. Therefore, the heat treatment after the oxidized film has been formed is indispensable. In order to examine the interface characteristics of the SiO$_2$ formed by the system of the present invention, the MOS (i.e., metal-oxide-semiconductor) diode having the structure of Al/SiO$_2$/Si was fabricated to evaluate the interface level by measuring the capacitance-voltage characteristics. At this time, the vacuum evaporation of Al is so sufficiently carefully conducted as to prevent the radiation damage caused by the electrons.

Figure 8:
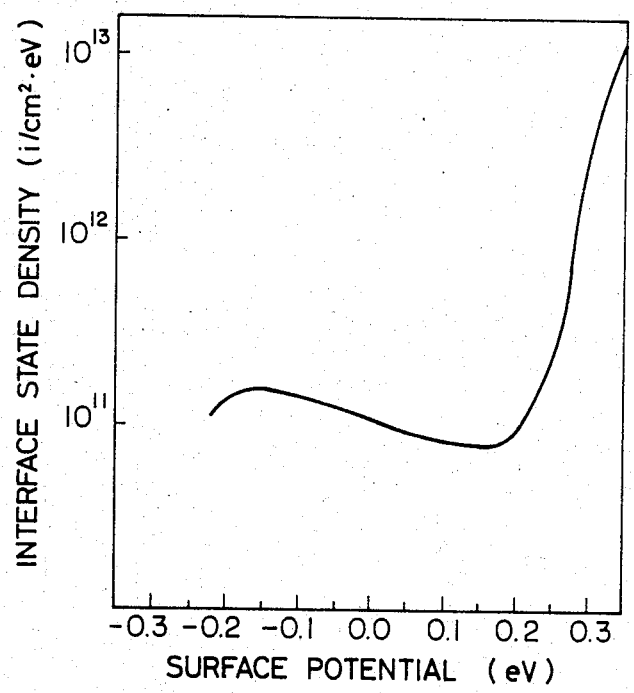

FIG. 8 depicts the interface level density obtained. Without any heat treatment after formation of the oxide layer, the interface level density near a mid-gap takes a value of $10^{11}$ cm$^2 \cdot$eV$^{-1}$, which is lower by 1 to 3 orders than that of the layer formed by the plasma anodization system of the prior art.

Thus, if the system of the present invention is used, the silicon dioxide layer of high quality can be formed in an excellently controllable manner even at a temperature as low as 600° C. Moreover, the oxide layer of a material such as GaAs, Pb or Nb having a thickness of 10 to 500 Å can also be formed in an excellently controllable manner even at a temperature as low as a room temperature.

The system according to the present invention can be used to form an oxide layer, which is excellent in electrical, optical and mechanical properties, by oxidizing all the metals such as Si, GaAs, Pb or Nb. Especially, as compared with the plasma anodization system of the prior art, the oxide layer having less damage and less contamination due to impurities can be formed at a temperature lower than 1,000° C.

What is claimed is:

1. A plasma anodization system comprising: a vacuum chamber; a gas plasma source for generating a plasma containing at least oxygen; and a table for holding a substance to be oxidized, wherein the improvement comprises means for generating at least one cusp field between said gas plasma source and the substance held on said table so as to prevent ions or electrons in the gas plasma from bombarding the surface of the substance held on the table.

2. A plasma anodization system according to claim 1, further including means for applying a bias voltage, which is positive with respect to a weakly ionized secondary plasma present in the surface layer of the substance held on said table, to said substance to be oxidized.

3. A plasma anodization system according to claim 1, wherein said cusp field generating means includes at least two air core coils arranged to surround said vacuum chamber.

4. A plasma anodization system according to claim 1, wherein said table includes means for heating said substance to be oxidized.

5. A plasma anodization system according to claim 2, wherein said cusp field generating means includes at least two air core coils arranged to surround said vacuum chamber.

6. A plasma anodization system according to claim 2, wherein said table includes means for heating said substance to be oxidized.

7. A plasma anodization system according to claim 3, wherein said table includes means for heating said substance to be oxidized.

8. A plasma anodization system according to claim 1, wherein said cusp field generating means includes at least one permanent magnet.

9. A plasma anodization system according to claim 3, wherein a microwave power having a frequency f (Hz) to be supplied to said plasma source is expressed by the following formula, if the magnetic field to be generated by said air core coils is designated by B (tesla) and if the mass of ion electrons is designated by m (Kg):

$$f = eB/2\pi m.$$

10. A plasma anodization system according to claim 1, wherein the cusp field generated by said means is generated such that the magnetic lines extending from said gas plasma source diverge toward the wall of said vacuum chamber.

11. A plasma anodization system according to claim 1, wherein the cusp field generating means comprises means to generate a cusp field having magnetic lines which extend from the gas plasma source and do not reach the substance to be oxidized.

12. A plasma anodization system according to claim 1, wherein the gas plasma source includes inlet means for adding oxygen so as to form the plasma containing at least oxygen.

13. A plasma anodization system according to claim 2, further comprising vacuum means for providing a vacuum in the vacuum chamber of a magnitude such that said weakly ionized secondary plasma is present.

14. A plasma anodization system according to claim 4, wherein said means for heating is a means for heating the substance to be oxidized to a temperature lower than 1000° C.

* * * * *